(12) United States Patent
Chou

(10) Patent No.: US 9,188,395 B2
(45) Date of Patent: Nov. 17, 2015

(54) HEAT PIPE AND METHOD OF MANUFACTURING A HEAT PIPE

(75) Inventor: Wei-Cheng Chou, New Taipei (TW)

(73) Assignee: Wistron Corporation, Hsichih, New Taipei (TW)

(*) Notice: Subject to any disclaimer, the term of this patent is extended or adjusted under 35 U.S.C. 154(b) by 413 days.

(21) Appl. No.: 13/568,139

(22) Filed: Aug. 7, 2012

(65) Prior Publication Data

US 2013/0126128 A1 May 23, 2013

(30) Foreign Application Priority Data

Nov. 17, 2011 (TW) .............................. 100142158 A

(51) Int. Cl.
 F28D 15/02 (2006.01)
 H01L 23/427 (2006.01)
 F28D 15/04 (2006.01)

(52) U.S. Cl.
 CPC ............ F28D 15/0283 (2013.01); F28D 15/04 (2013.01); F28D 15/046 (2013.01); H01L 23/427 (2013.01); *Y10T 29/49353* (2015.01)

(58) Field of Classification Search
 CPC ..... H01L 23/427; H01L 23/473; B23P 15/26; F28D 15/0283; F28D 15/046; F28D 15/0233; Y10T 29/49353; Y10T 29/4935; Y10T 29/49377
 USPC ......... 29/890.032, 890.03, 890.045; 427/127, 427/130, 198, 226, 239; 165/104.26, 165/104.21, 104.33; 118/308; 257/E23.088; 75/330
 See application file for complete search history.

(56) References Cited

U.S. PATENT DOCUMENTS

| 7,559,143 B2* | 7/2009 | Hou et al. ................ 29/890.032 |
| 7,802,362 B2* | 9/2010 | Hou et al. ................ 29/890.032 |
| 2007/0048165 A1* | 3/2007 | Hou et al. ........................ 419/8 |

FOREIGN PATENT DOCUMENTS

| CN | 101581549 A | 11/2009 |
| TW | M292239 | 6/2006 |
| TW | 200644775 | 12/2006 |
| TW | I286596 | 9/2007 |
| TW | I289191 | 11/2007 |
| TW | 201009283 A | 3/2010 |
| TW | 201104203 | 2/2011 |
| TW | M410206 | 8/2011 |

OTHER PUBLICATIONS

Office action mailed on Apr. 21, 2014 for the China application No. 201110401263.X, p. 3 line 5-30 and p. 4 line 1-17, Translation.
Office action mailed on Jan. 15, 2014 for the Taiwan application No. 100142158, filing date: Nov. 17, 2011, p. 2 line 7-26, p. 3-6 and p. 7 line 1-14.

* cited by examiner

*Primary Examiner* — Sarang Afzali
(74) *Attorney, Agent, or Firm* — Winston Hsu; Scott Margo

(57) ABSTRACT

The method of manufacturing heat pipe is disclosed to insert a center bar into a metal tube such that the center bar contacts a clearance area of the inner sidewall of the metal tube. Then, the method is to fill the interval between the center bar and the metal tube with powder for sintering. At last, the method is to perform a sintering, extract the center bar, inject working fluid, and close the metal tube. A heat pipe is therefore formed. Because of no sintered powder on the clearance area, the heat pipe can be bent at the clearance area without damaging the capillary structure formed by the sintered powder. The flow path of the working fluid is not interrupted or influenced, so the heat transfer efficiency can be maintained, which overcomes the decrement of the heat transfer efficiency of a bent heat pipe in the prior art.

5 Claims, 12 Drawing Sheets

HEAT PIPE AND METHOD OF MANUFACTURING A HEAT PIPE

BACKGROUND OF THE INVENTION

1. Field of the Invention

The invention relates to a heat pipe, and a method of manufacturing heat pipe, and especially relates to a heat pipe with a sintered powder layer as capillary structure and a method of manufacturing the same.

2. Description of the Prior Art

Heat pipes improve heat transfer efficiency by use of a capillary structure and the phase change of working fluid therein. The heat dissipation efficiency is much better than that based on single-phase heat transfer. Recently, the heat pipe has been applied to heat-dissipating components of 3C productions widely. However, in practice, the heat pipe often needs to be deformed by bending and pressing flat to meet the design for thin heat-dissipating module. According to experiment results, the heat dissipation efficiency of the heat pipe after greatly pressed flat or bent tends downwards. The reason therefor is that because the capillary structure sustains compressive stress and tensile stress during the bending and pressing process, peelings or cracks occur in the capillary structure inside the heat pipe. The capillary force for the working fluid is therefore reduced even to failed to push the working fluid, which influences the performance of heat transfer of the heat pipe seriously. Furthermore, the tube wall at the inner side is under compressive stress to induce buckling thereon during the bending on the heat pipe. Especially for a thinner tube wall, the buckling occurs more probably. A slight buckling on the tube wall will change the flow path of the working fluid; a serious buckling on the tube wall will damage the capillary structure, even to make the capillary structure peel off from the tube wall, leading to a breach, stagnation and so on in the flow path of the working fluid. Hence, in the industry, the heat pipes are usually bent under the conditions of the bending angle less than 90 degrees and the value of the bending radius larger than three times the value of the diameter of the heat pipe. However, for the current tendency of miniaturization on electronic devices, it has been unavoidable to bend the heat pipes by large angle and small radius. Therefore, how to maintain a good heat transfer efficiency of the heat pipe after bent by large angle and small radius has been a challenge for the industry for a long time.

SUMMARY OF THE INVENTION

An objective of the invention is to provide a heat pipe, which has an area without capillary structure, so the heat pipe can be bent at this area to avoid damaging a capillary structure formed on other area of the heat pipe, so that the heat transfer efficiency of the heat pipe will not be influenced noticeably after the bending process.

The heat pipe of the invention includes a metal tube and a sintered powder layer. The inner sidewall of the metal tube thereon defines a clearance area. The sintered powder layer is formed on the inner sidewall without covering the clearance area; that is, there is no sintered powder layer on the clearance area. The sintered powder layer functions as the capillary structure of the heat pipe. Further, the heat pipe can be bent to form a bent portion of the metal tube. The clearance area is at the inner side or the outer side of the bent portion. Therefore, the probable serious structural influence on the heat pipe due to the bending will be limited within the clearance area. The capillary structure on the other area inside the heat pipe can be maintain fully so that the heat transfer efficiency of the heat pipe will not be influenced noticeably after the bending process.

Another objective of the invention is to provide a method for manufacturing the heat pipe of the invention.

The method of manufacturing heat pipe of the invention includes the following steps: preparing a metal tube having a closed end and an open end, wherein the inner sidewall of the metal tube thereon defines a clearance area; fixing the metal tube; preparing a center bar; inserting the center bar into the metal tube through the open end to be fixed such that the center bar contacts the clearance area, wherein an interval is formed between the center bar and the metal tube; filling the interval with powder for sintering; sintering the powder for sintering to form a sintered powder layer; and extracting the center bar. The method of manufacturing heat pipe can be further to inject a working fluid into the metal tube and close the open end; the heat pipe of the invention is therefore completed. In practice, the method of manufacturing heat pipe can realize the clearance area without being covered by the sintered powder layer by use of a center bar with a slider structure or by eccentrically fixing the center bar. However, the invention is not limited thereto.

In sum, the heat pipe made by the method of manufacturing heat pipe of the invention has the clearance area without being covered by the capillary structure. If needed, the heat pipe can be bent at the clearance area so that the serious structural influence on the heat pipe due to the bending can be limited within the clearance area, so as to reduce the influence by the deformed structure on the whole capillary structure of the heat pipe. Therefore, the heat transfer efficiency of the heat pipe will not be influenced noticeably after the bending process, which solves the problem that once a conventional heat pipe is bent, the heat transfer efficiency thereof decreases seriously. Furthermore, the heat pipe of the invention can sustain a bending of large angle and small radius at the clearance area because there is no capillary structure on the clearance area, which is conducive to deforming the heat pipe to fit the space constraint for miniaturized electronic devices.

These and other objectives of the invention will no doubt become obvious to those of ordinary skill in the art after reading the following detailed description of the preferred embodiment that is illustrated in the various figures and drawings.

DETAILED DESCRIPTION

Figure 1:
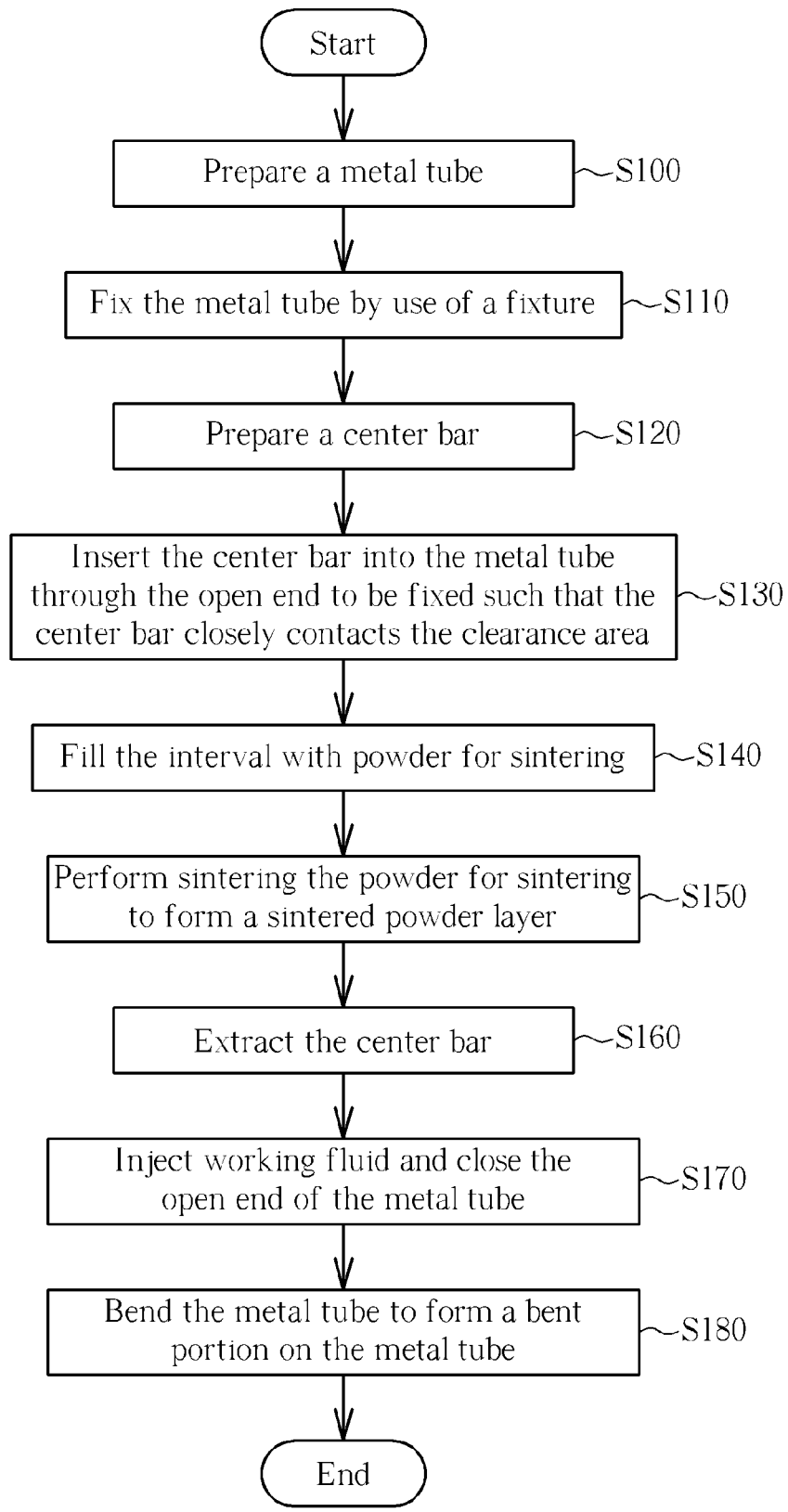
FIG. 1 is a flow chart of a method of manufacturing heat pipe of a first embodiment according to the invention.
Figure 2:
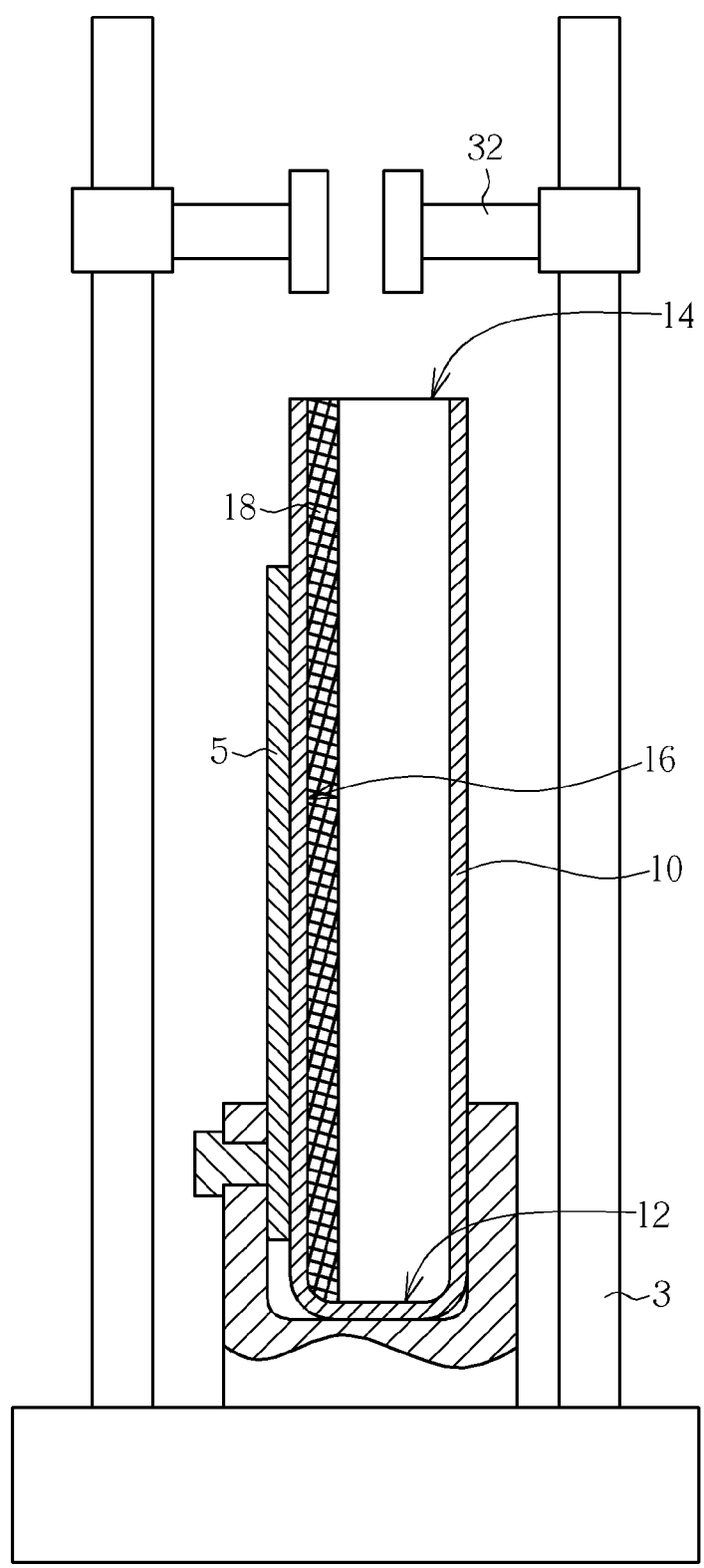
FIGS. 2 through 6 are schematic diagrams illustrating the manufacturing process for a heat pipe according to the flow chart in FIG. 1.

Please refer to FIGS. 1 through 6. FIG. 1 is a flow chart of a method of manufacturing heat pipe of a first embodiment according to the invention. FIGS. 2 through 6 are schematic diagrams illustrating the manufacturing process for a heat pipe 1 (shown in FIG. 6) according to the first embodiment. The method of manufacturing heat pipe is to prepare a metal tube 10 first, as shown by the step S100; to fix the metal tube 10 by use of a fixture 3, as shown by the step S110. After the fixing, it is shown in FIG. 2; therein the metal tube 10 and a part of the fixture 3 are sectioned. The metal tube 10 has a closed end 12 and an open end 14. The metal tube 10 is fixed with the open end 14 upward. The inner sidewall 16 of the metal tube 10 thereon defines a clearance area 18 shown by dashed lines.

Figure 3:
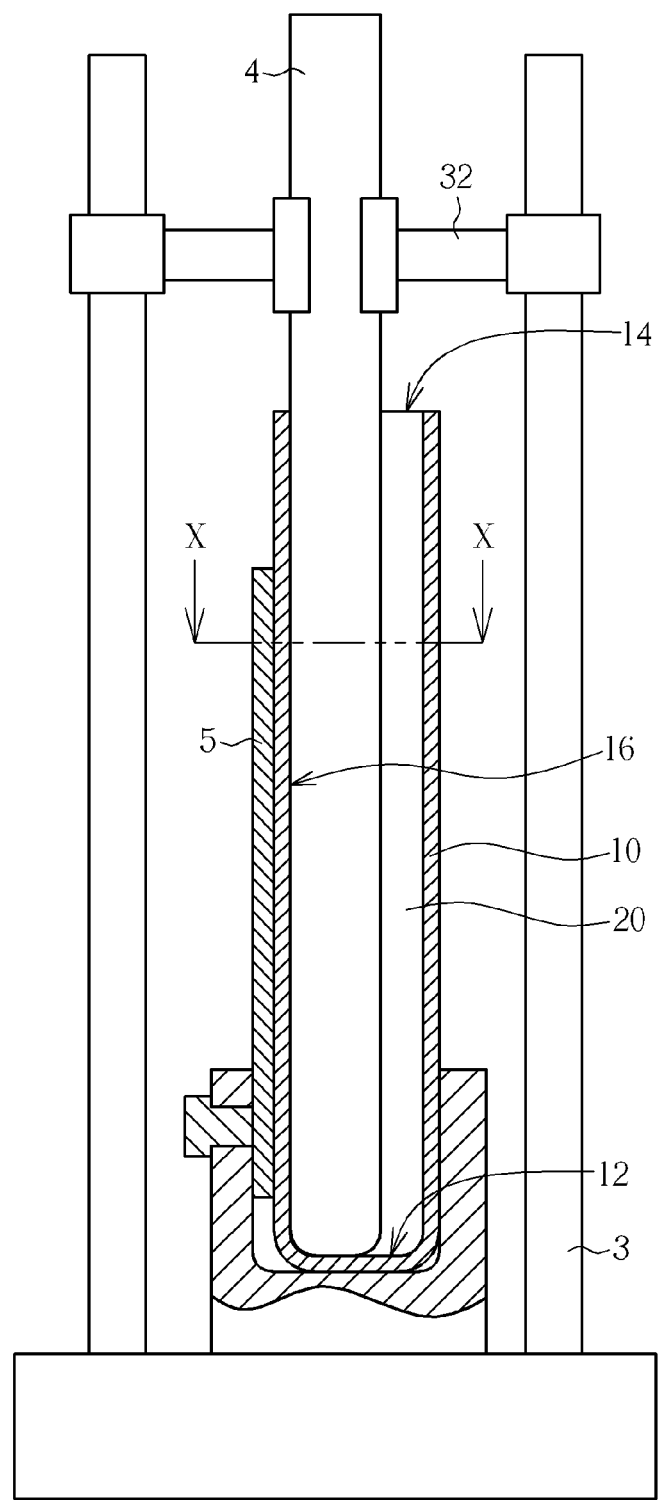
Figure 4:
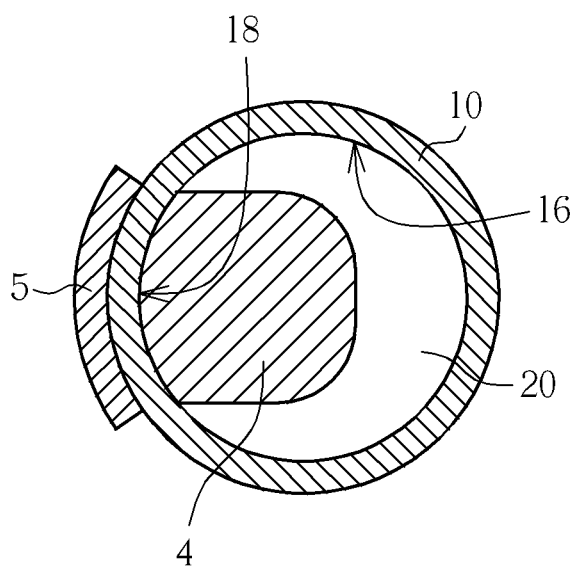

Afterward, the method of manufacturing heat pipe is to prepare a center bar 4, as shown by the step S120; to insert the center bar 4 into the metal tube 10 through the open end 14 to be fixed such that the center bar 4 tightly contacts the clearance area 18, as shown by the step S130. After the fixing, it is shown in FIG. 3; therein the clearance area 18 is not shown in FIG. 3 because it is covered by the center bar 4. The sectional diagram of the metal tube 10 and the center bar 4 is shown in FIG. 4. The cutting position therefor is indicated by the line X-X in FIG. 3. The clearance area 18 is equivalent to the surface of the metal tube 10 the center bar 4 contacts. In the first embodiment, the center bar 4 is eccentrically fixed relative to the metal tube 10; that is, the center of the center bar 4 is shifted from the center of the metal tube 10. An interval 20 therefore exists between the center bar 4 and the metal tube 10. If the center bar 4 is magnetic, such as stainless steel JIS SUS410, the fixing for the center bar 4 can be performed directly by use of the fixture 3 such as the clamper 32 thereof or by attaching a bar-like magnet 5 onto the outer side of the metal tube 10 correspondingly to the clearance area 18 to attract the center bar 4 to tightly contact the clearance area 18. In the first embodiment, the fixing for the center bar 4 adopts the above two methods. In addition, in the first embodiment, in order that the center bar 4 tightly contacts the clearance area 18, the cross sectional profile of the center bar 4 matches with the cross sectional profile of the metal tube 10 at the clearance area 18.

It is added that a conventional heat pipe is usually made of copper. In principle, copper products are not magnetic. Magnet cannot be attached on the copper tube by magnetic attraction, so in practice, the above bar-like magnet 5 together with the metal tube 10 can be fixed by the fixture 3, as shown in FIG. 2 and FIG. 3; however, the invention is not limited thereto. In addition, a mechanism for fixing the center bar 4 generally applies force on an end portion of the center bar 4; the middle portion of the center bar 4 generally sustains no force. In the first embodiment, as shown in FIG. 3, an end of the center bar 4 is against the closed end 12 of the metal tube 10. The exposed portion of the center bar 4 out of the metal tube 10 is clamped by the fixture 3. The middle portion of the center bar 4 is affected by the magnetic attraction by the bar-like magnet 5. It is conducive to keeping the center bar 4 on tightly contacting the clearance area 18 during vibration, so as to avoid the fall of the powder for sintering onto the clearance area 18 efficiently; however, the invention is not limited thereto.

Figure 5:
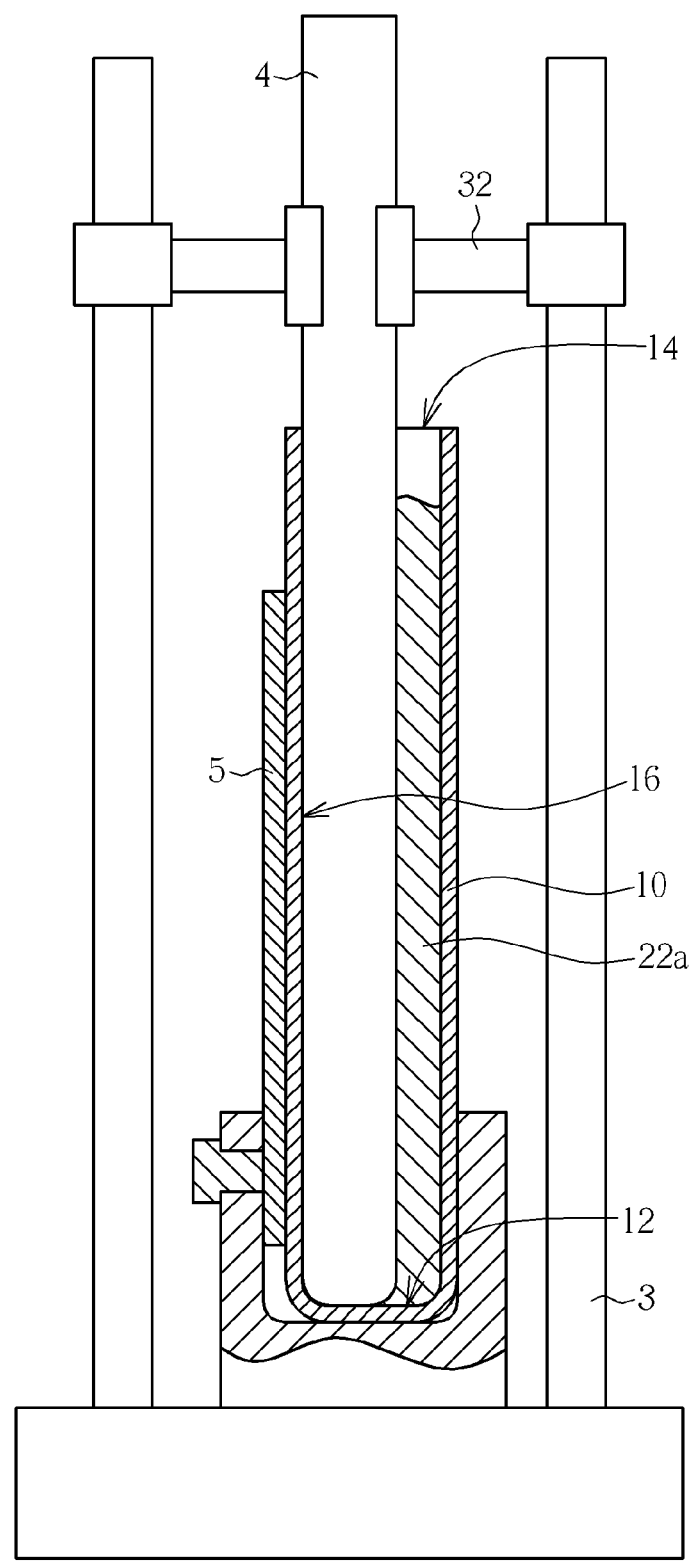

Afterward, the method of manufacturing heat pipe is to fill the interval 20 with powder for sintering 22a, as shown by the step S140. After the filling, it is shown in FIG. 5. In the first embodiment, the metal tube 10 is a copper tube. Copper powder is used as the powder for sintering 22a so as to improve the binding strength between the powder for sintering 22a and the metal tube 10. In order to closely and uniformly pack the powder for sintering 22a (shown by dashed lines in FIG. 5), the method of manufacturing heat pipe can use a vibration disk or the like to vibrate the metal tube 10 (together with the center bar 4, the fixture 3 and so on) so that the powder for sintering 22a is closely and uniformly packed; however, the invention is not limited thereto. Afterward, the method of manufacturing heat pipe is to put the metal tube 10 (together with the center bar 4, the fixture 3 and so on) into an oven for sintering for the powder for sintering 22a to form a sintered powder layer 22b, as shown by the step S150. The sintered powder layer 22b functions as the capillary structure of the heat pipe 1. Because the center bar 4 tightly contacts the clearance area 18, the sintered powder layer 22b does not cover the clearance area 18. In the first embodiment, the sintered powder layer 22b is a sintered copper powder layer; however, the invention is not limited thereto. In principle, the powder for sintering 22a uses the same material as the metal tube 10, or the powder for sintering 22a uses the material which can react with the metal tube 10 such as to form a reaction layer to firmly bind with the metal tube 10. It is added that in the first embodiment, the interval 20 is shown with exaggeration, so the thickness of the sintered powder layer 22b is also shown with exaggeration for clear illustration, which is also applicable to the following embodiments and will not be mentioned later.

Figure 6:
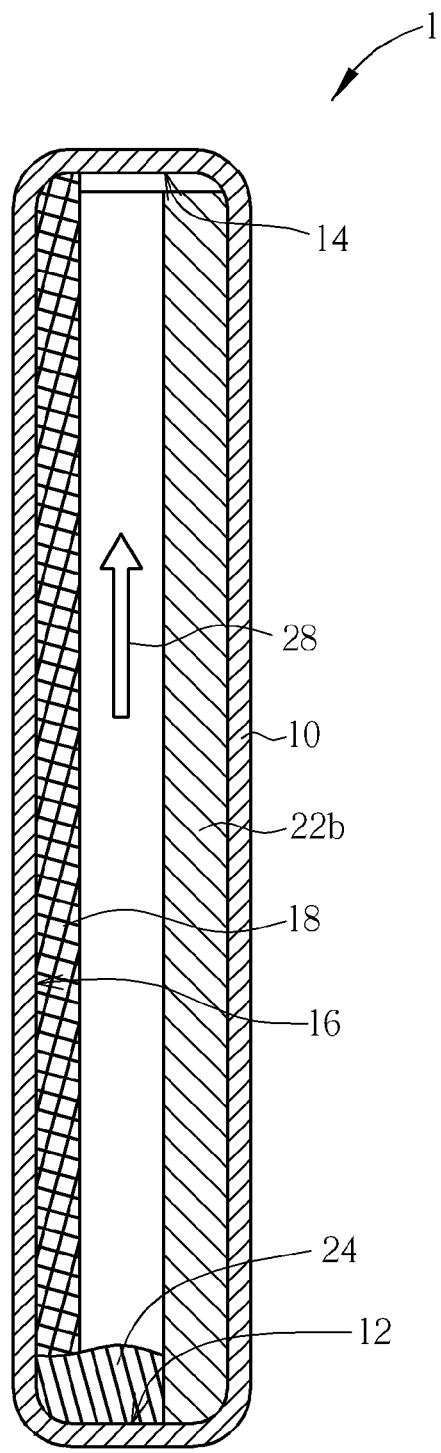

Afterward, after taking out the metal tube 10 (together with the center bar 4, the fixture 3 and so on) from the oven, the method of manufacturing heat pipe is to extract the center bar 4, as shown by the step S160; then to inject working fluid 24 and close the open end 14 of the metal tube 10, as shown by the step S170. At this moment, the heat pipe 1 is therefore completed, of which the sectional diagram is shown in FIG. 6.

Figure 7:
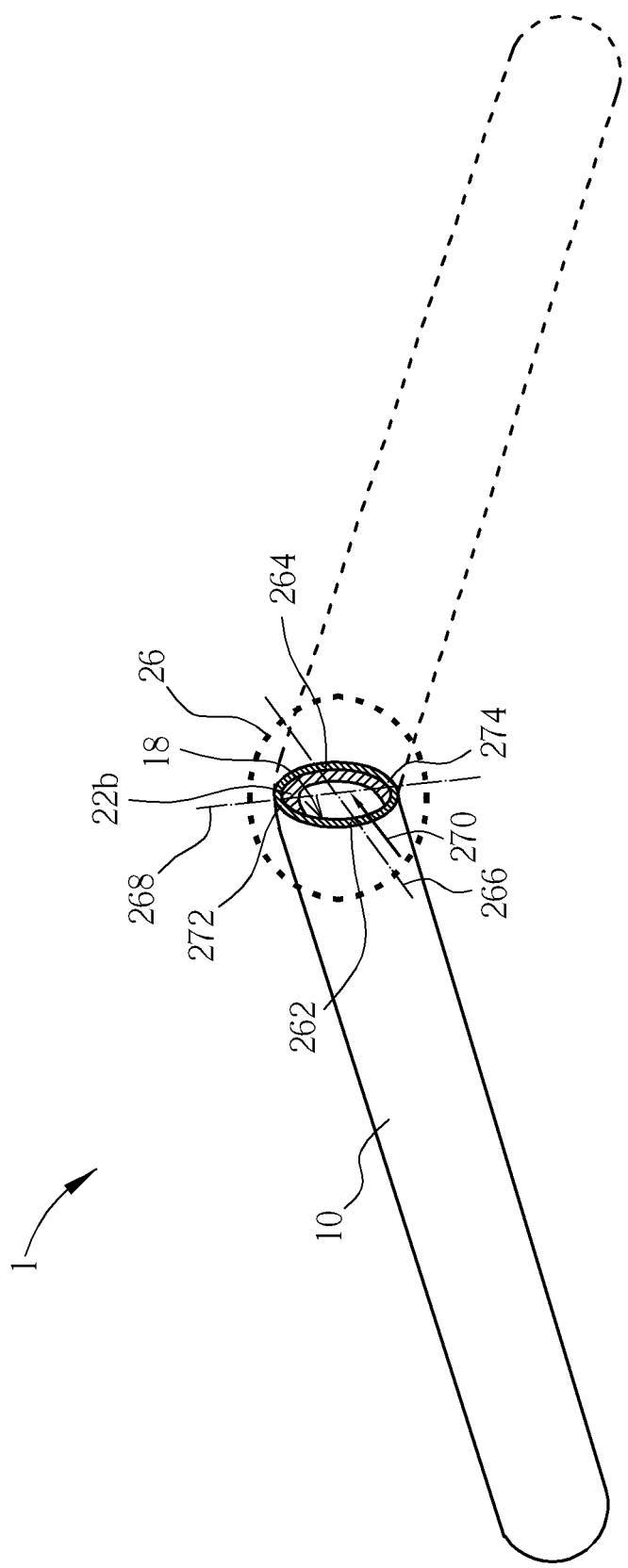
FIG. 7 is a schematic diagram illustrating the bent heat pipe in FIG. 7.

In practice, the heat pipe 1 may need to be bent to fit the disposition environment. Please also refer to FIG. 7. FIG. 7 is a schematic diagram illustrating the bent heat pipe 1; therein the heat pipe 1 is sectioned at the bent portion, and the profile of the removed portion is shown by dashed lines. The method of manufacturing heat pipe is further to bend the metal tube 10 (or the heat pipe 1) to form a bent portion 26 (shown by bold dashed lines) on the metal tube 10, as shown by the step S180. The bent portion 26 has an inner side 262 and an outer side 264. The definition of the inner side 262 and the outer side 264 is based on a bending plane 266 of the bent portion 26. The position of the bending plane 266 at the cross section of the heat pipe 1 is indicated by a dashed line. The bending plane 266 is equivalent to the plane where the deflection of the bent portion 26 occurs. Therefore, the inner side 262 of the bent portion 26 is located at the portion with smaller bending radius; the outer side 264 is located at the portion with larger bending radius. In the first embodiment, the clearance area 18 is located at the inner side 262 of the bent portion 26. The position of the clearance area 18 at the cross section of the heat pipe 1 is indicated by an arrow. Besides, in the first embodiment, the bent portion 26 is purely bent, so a neutral plane 268 of the bent portion 26 is located within the heat pipe 1. The position of the neutral plane 268 at the cross section of the heat pipe 1 is indicated by a dashed line. The inner side 262 of the bent portion 26 sustains compressive stress while the outer side 264 of the bent portion 26 sustains tensile stress. If the strain of the outer side 264 of the bent portion 26 is within an allowable range therefor, the sintered powder layer 22b at the outer side 264 can be structurally maintained. However, even if the stress induced in the inner side 262 is within an allowable range therefor, the inner side 262 of the bent portion 26 still may buckle. Because the sintered powder layer 22b does not cover the clearance area 18 at the inner side 262, the sintered powder layer 22b will not be affected by the buckling. At least the mechanism of transporting the working fluid is not affected much. In other words, the value of the bending radius 270 of the bent portion 26 is not limited to the conventional limitation of being larger than three times the value of the diameter of the heat pipe 1, so in practice, the value of the bending radius 270 can be designed to be smaller than three times the value of the diameter of the metal tube 10, so that the heat pipe 1 can be provided in various structures and is applicable to being disposed in a miniaturized device. For example, when the heat pipe 1 needs to be bent, the value of the bending radius 270 can be designed to be from two to three times the value of the diameter of the metal tube 10; such bending condition is sufficient to satisfy most disposition requirements.

It is added that in the cross section in FIG. 7, there is no capillary structure at the inner side 262 of the heat pipe 1, but the thickness of the sintered powder layer 22b at the outer side 264 (i.e. opposite to the clearance area 18) is thicker than that of other portions of the sintered powder layer 22b, so as to increase its loading of transporting the working fluid so that the total efficiency of the sintered powder layer 22b for transporting the working fluid is not affected much by the existence of the clearance area 18. It is added more that in the first embodiment, the bent portion 26 is purely bent, but the invention is not limited thereto. For example, during the bending on the heat pipe 1, a tensile force is applied on the heat pipe 1 such that both the inner side 262 and the outer side 264 of the bent portion 26 sustain tensile stress. In this case, the fact that the outer side 264 sustains larger stress may induce cracking of the sintered powder layer 22b into pieces or peeling of the sintered powder layer 22b from the metal tube 10. For this case, the clearance area 18 is suitable to be disposed at the outer side 264 so as to reduce or eliminate the influence of the pieces of the sintered powder layer 22b on the whole heat transfer efficiency of the capillary structure of the heat pipe 1.

In addition, in FIG. 7, the stress within the upper side 272 and the lower side 274 of the bent portion 26 is smaller than the stress of the inner side 262 and the outer side 264, so it is not easy to damage the sintered powder layer 22b at the upper side 272 and the lower side 274. Further, the thickness thereof can be thickened to increase the capability of transporting the working fluid. Moreover, the sintered powder layer 22b still covers the upper side 272 and the lower side 274 of the bent portion 26. Even if there is none of the sintered powder layer 22b at the inner side 262 and the outer side 264 of the bent portion 26, the capillary structure of the heat pipe 1 is still continuous. The whole function of transferring heat still performs effectively. In such case, the heat pipe 1 can sustain a smaller bending radius so that the heat pipe 1 can fit more various disposition space constraints.

Figure 8:
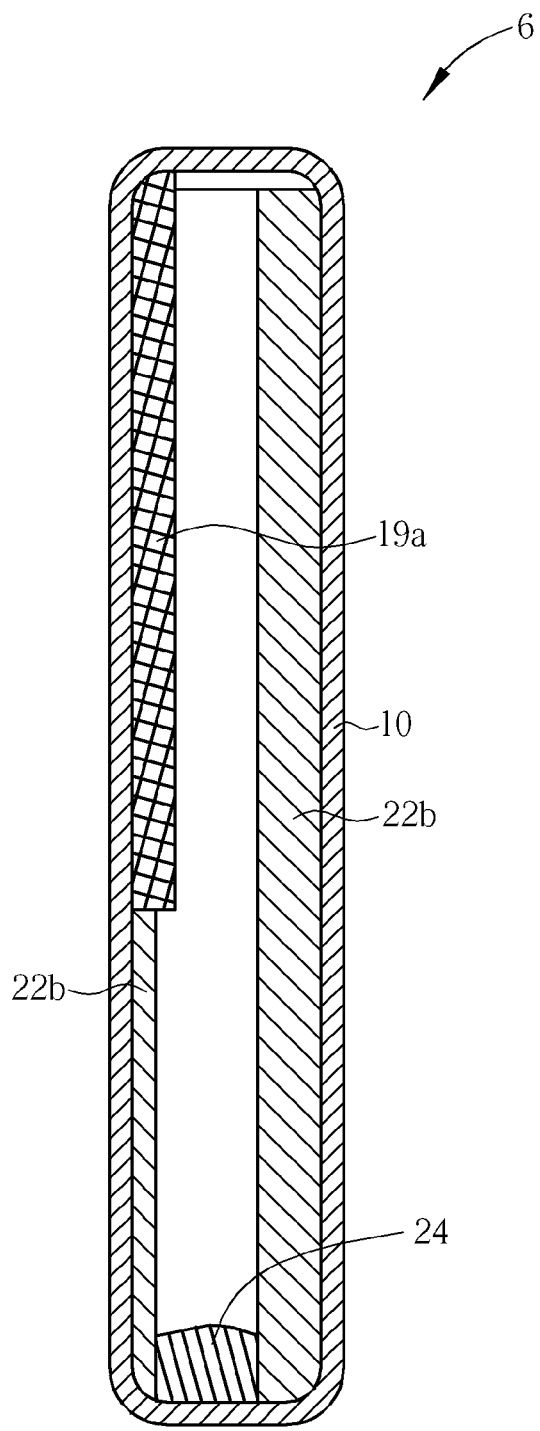
FIG. 8 is a sectional view of a heat pipe according to a second embodiment.

As shown in FIG. 6, in the first embodiment, the metal tube 10 extends in a direction 28 (indicated by an arrow). The clearance area 18 also extends in the direction 28 to an end portion of the metal tube 10, i.e. the open end 14. The extent the clearance area 18 almost spreads through the whole metal tube 10; however, the invention is not limited thereto. Please refer to FIG. 8, which is a sectional view of a heat pipe 6 according to a second embodiment. The heat pipe 6 and the heat pipe 1 are structurally the same. The main difference is that the clearance area 19a (the extent is shown by dashed lines) of the heat pipe 6 only extends from the middle portion of the metal tube 10 to an end of the metal tube 10. It is can be realized by changing the profile of the center bar 4. For example, the center bar 4 thereon forms a step structure. The realization detail therefor can be understood and embodied by a person of ordinary skill in the art and not be described specially.

Figure 9:
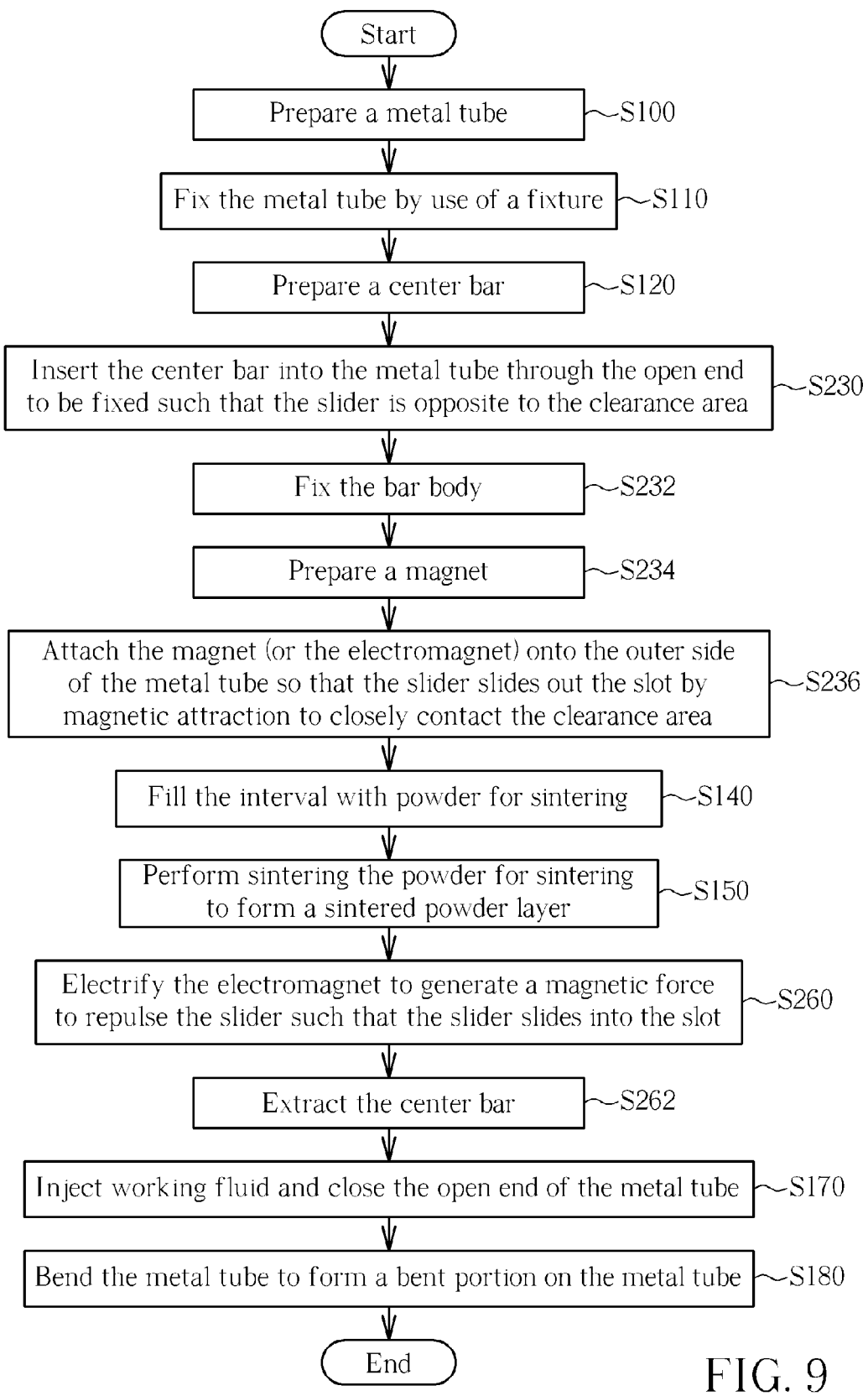
FIG. 9 is a flow chart of a method of manufacturing heat pipe according to a third embodiment.
Figure 10:
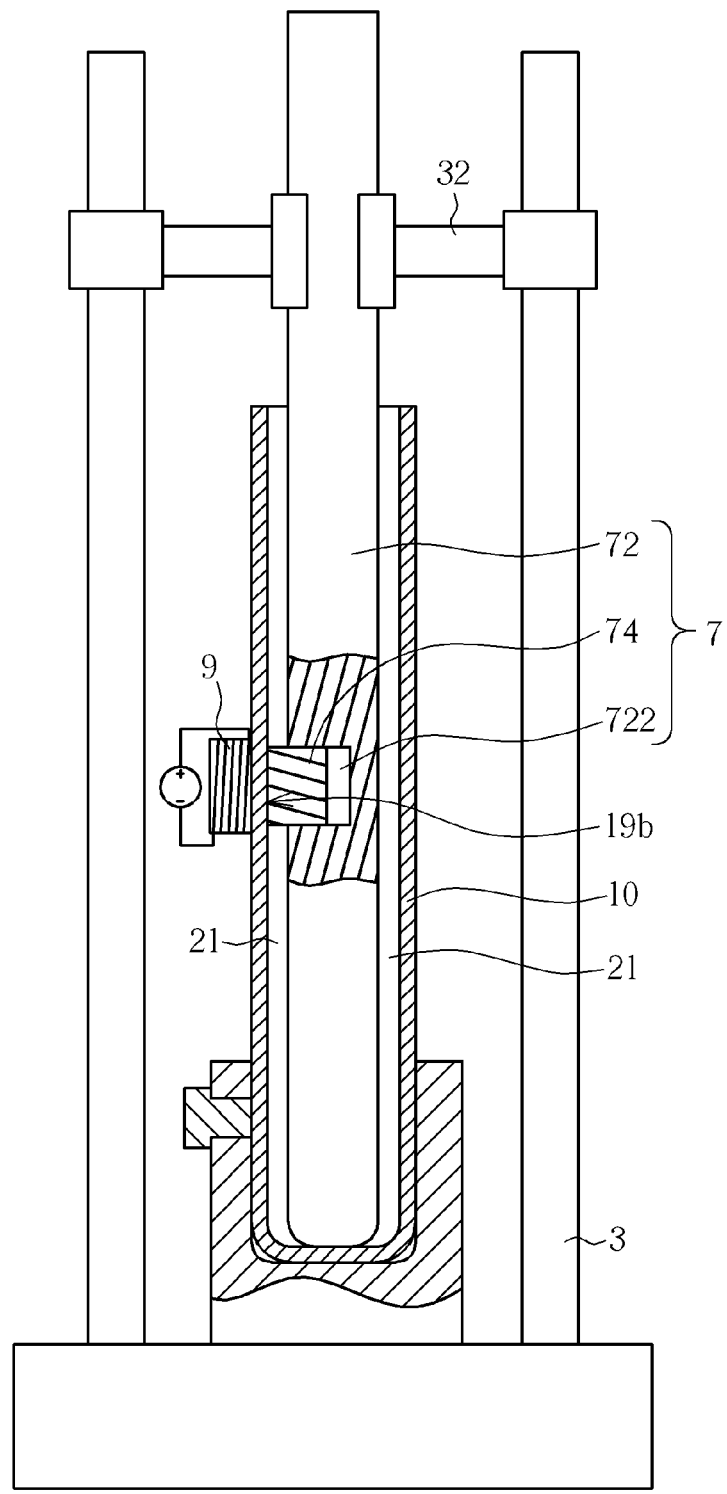
FIG. 10 is a schematic diagram illustrating the manufacturing process for a heat pipe according to the third embodiment.

Please refer to FIG. 9, which is a flow chart of a method of manufacturing heat pipe according to a third embodiment. The flow chart in FIG. 9 is substantially equal to the flow chart in FIG. 1. The main difference is that the fixing and extracting of the center bar 7 of the third embodiment is different to the fixing and extracting of the center bar 4 of the first embodiment. The following only focus on the difference; for other descriptions, please refer to relative descriptions of the first embodiment. Please also refer to FIG. 10. FIG. 10 is a schematic diagram illustrating the manufacturing process for a heat pipe 8 according to the third embodiment; therein the center bar 7 has been fixed. The structures of the heat pipe 8 and the heat pipe 1 are substantially structurally the same. The main difference is that the clearance area 19b of the heat pipe 8 is located only at the middle portion of the metal tube 10. In addition, the center bar 7 used for the heat pipe 8 is structurally different to the center bar 4. The center bar 7 includes a bar body 72 and a slider 74. The bar body 72 has a slot 722. The slider 74 is magnetic and is disposed in the slot 722 in a movable way. As shown by the step S230 in FIG. 9, the method of manufacturing heat pipe is to insert the center bar 7 into the metal tube 10 through the open end 14 to be fixed such that the slider 74 is opposite to the clearance area 19b; then to fix the bar body 72, as shown by the step S232. Therein, the bar body 72 is fixed also by use of the clamper 32 of the fixture 3. The method of manufacturing heat pipe is to prepare a magnet 9, as shown by the step S234; then to attach the magnet 9 onto the outer side of the metal tube 10 so that the slider 74 slides out the slot 722 by magnetic attraction to tightly contact the clearance area 19b, as shown by the step S236.

Till now, the center bar 7 has been fixed. The semi-finished product of the heat pipe 8 is shown in FIG. 10; therein an interval 21 exists between the center bar 7 and the metal tube 10. The clearance area 19b (covered by the slider 74 but indicated by an arrow) defined on the metal tube 10 of the heat pipe 8 is different to the clearance area 18 of the first embodiment. The interval 21 in the heat pipe 8 between the center bar 7 and the metal tube 10 is also different to the interval 20 of the first embodiment. So in the step S140 (please refer to FIG. 1 and the above relative descriptions), more powder for sintering can be filled into the heat pipe 8, and the sintered powder layer 22c (please refer to FIG. 11 or FIG. 12) can cover more area of the inner sidewall of the metal tube 10 so as to form a fuller capillary structure. In addition, in the third embodiment, the magnet 9 is an electromagnet, so in practice, the step S236 includes electrifying the electromagnet to generate a magnetic force to attract the slider 74; however, the invention is not limited thereto. For example, in practice, the magnet 9 can be a permanent magnet, and the slider 74 can be a magnetic object. When the magnet 9 approaches the slider 74, the slider 74 is magnetically attracted so as to achieve the purpose of the slider 74 tightly contacting the clearance area 19b.

Figure 11:
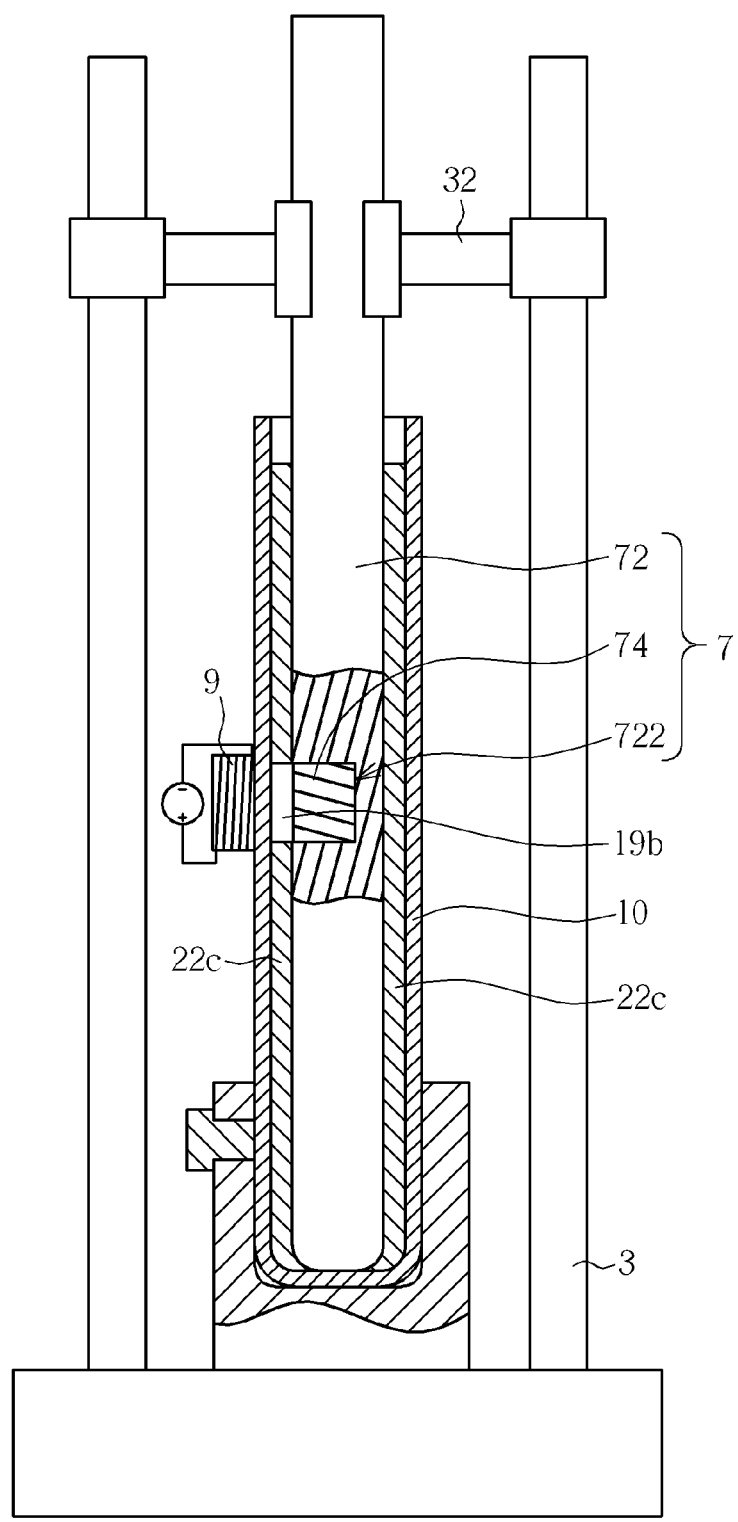
FIG. 11 is a schematic diagram illustrating the heat pipe after sintered according to the third embodiment.

Please also refer to FIG. 11, which is a schematic diagram illustrating the heat pipe 8 after sintered according to the third embodiment. When the powder for sintering is sintered, it is necessary to shrink the slider 74 into the slot 722 so that the center bar 7 can be extracted successfully. In the third embodiment, the slider 74 is a permanent magnet, so in the step S236, the method of manufacturing heat pipe is to electrify the electromagnet in a first current direction to generate a magnetic force to magnetically attract the slider 74. And in the step S260, the method of manufacturing heat pipe is to electrify the electromagnet in a second current direction reverse to the first current direction to generate a magnetic force to repulse the slider 74 such that the slider 74 slides into the slot 722. Then, the method of manufacturing heat pipe is to extract the center bar 7, as shown by the step S262. It is added that in the third embodiment, the method of manufacturing heat pipe is to directly electrify the magnet 9 by a direct current source to generate magnetic field thereof; that is, the generated magnetic poles can be controlled by use of the connection between electrodes of the direct current source and the electromagnet, so as to control the movement of the slider 74. However, the invention is not limited thereto. For example, after the sintering, the magnet 9 can be disposed on the opposite side of the metal tube 10 corresponding to the clearance area 19*b* alternatively such that the slider 74 can also be magnetically attracted to slide into the slot 722. For another example, a spring is disposed in the slot 722 to connect the slider 74 and the bar body 72 such that after the sintering, the magnet 9 is moved away, and the spring can drag the slider 74 back to the slot 722; therein the elastic force generated by the spring can be designed to be smaller than the magnetic force of the magnet 9 to the slider 74. And for another example, the slide-in and slide-out action of the slider 74 in the slot 722 can be realized by another mechanism; in such case, the magnet 9 can be omitted.

Figure 12:
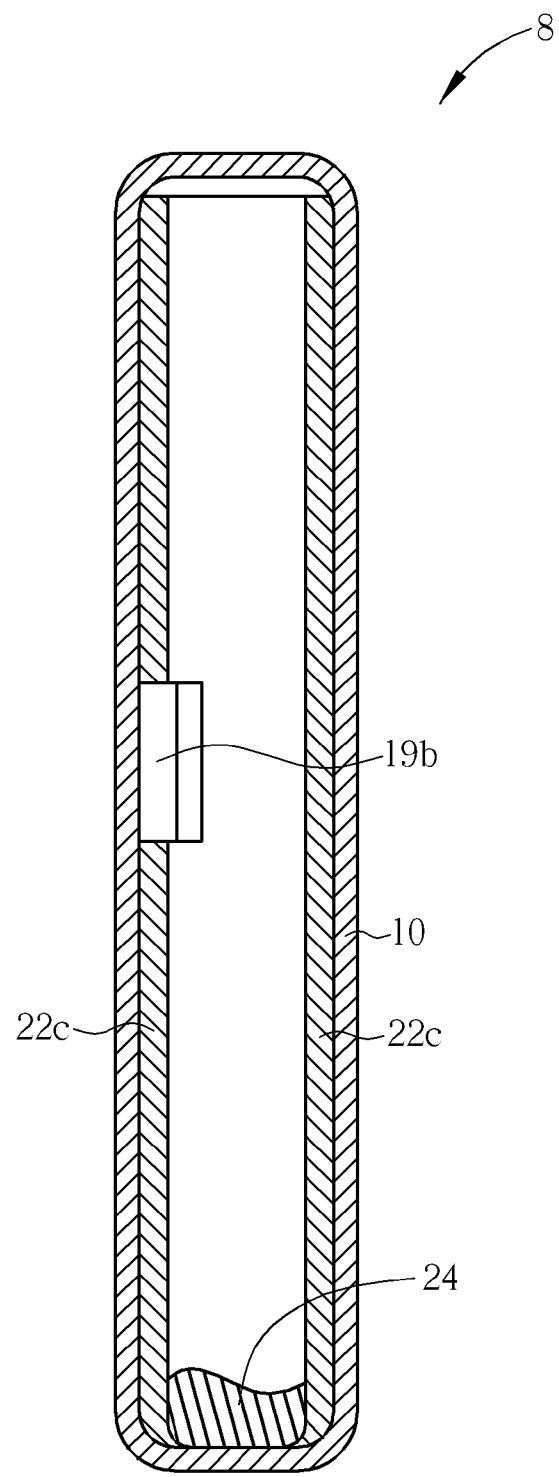
FIG. 12 is a sectional view of the heat pipe according to the third embodiment.

Please refer to FIG. 12, which is a sectional view of the heat pipe 8 according to the third embodiment. After the center bar 7 is extracted, the method of manufacturing heat pipe performs the step S170 (please refer to FIG. 1 and the above relative descriptions) to form the heat pipe 8. As shown in FIG. 12, the clearance area 19*b* is located only at the middle portion of the metal tube 10, so the sintered powder layer 22*c* in the heat pipe 8 still covers the most inner sidewall of the metal tube 10, which reduces the influence of the clearance area 19*b* on the efficiency of the capillary structure of the heat pipe 8 transporting the working fluid. In most practical cases of bending a heat pipe, the heat pipe usually has only one bent portion, further at the middle portion of the heat pipe. Therefore, the heat pipe 8 is applicable to the most bending cases. Furthermore, in the third embodiment, the clearance area 19*b* of the heat pipe 8 is located at the middle of the metal tube 10; however, the invention is not limited thereto. In practice, the clearance area 19*b* can certainly be disposed at other portion of the metal tube 10 by request. Besides, the disposition quantity of the clearance area 19*b* can certainly depend on request. Furthermore, in practice, several dispositions of the clearance areas 19*b* are not limited to be located at the same side of the heat pipe 8, which is conducive to the realization of a three-dimensional one of the heat pipe 8.

It is added that the above embodiments are illustrated on the basis of the circular metal tube 10; however, the invention is not limited thereto. In the prior art, it is usually to press a heat pipe with circle cross section to form a heat pipe with required cross section, but such manufacturing process will damage the capillary structure in the heat pipe more or less. On the contrary, the invention can manufacture a heat pipe directly by use of a metal tube with rectangle cross section. The center bar therefor in the manufacturing process is selected correspondingly. In this case, the heat pipe with non-circular cross section is therefore formed, and the capillary structure therefor can also be formed with less damage.

As discussed above, the method of manufacturing heat pipe according to the invention uses the center bar contacting the inner sidewall of the metal tube to form the clearance area, so as to produce the heat pipe having the clearance area without capillary structure. In use, the heat pipe can be bent by use of the clearance area so that the capillary structure on other area will not be damage much. Therefore the whole heat pipe can sustains a bending with larger bending angle and smaller bending radius than the prior art, so as to fit more various disposition environments. In sum, the invention overcomes the use limitations of the heat pipe in the prior art to enhance the variety of the bent structural of the heat pipe and to reduce the influence of the bending on the capillary structure efficiently.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of manufacturing a heat pipe, comprising the following steps:
   (a) preparing a metal tube having a closed end and an open end, wherein an inner sidewall of the metal tube defines a clearance area;
   (b) fixing the metal tube;
   (c) preparing a center bar, the center bar comprising a bar body and a slider, the bar body having a slot, the slider being magnetic and being disposed in the slot in a movable way;
   (d1) inserting the center bar into the metal tube through the open end, such that the slider is opposite to the clearance area;
   (d2) fixing the bar body, wherein an interval is formed between the center bar and the metal tube;
   (d3) preparing a magnet;
   (d4) attaching the magnet onto an outer side of the metal tube, such that the slider slides out the slot by magnetic attraction to tightly contact the clearance area;
   (e) filling the interval with powder for sintering;
   (f) sintering the powder for sintering to form a sintered powder layer; and
   (g) extracting the center bar.

2. The method of manufacturing a heat pipe of claim 1, wherein the magnet is an electromagnet, and the step (d4) further comprises the following step:
   electrifying the electromagnet in a first current direction to generate a magnetic force to attract the slider.

3. The method of manufacturing a heat pipe of claim 2, wherein the slider is a permanent magnet, and the step (g) further comprises the following step:
   electrifying the electromagnet in a second current direction reverse to the first current direction to generate a magnetic force to repulse the slider such that the slider slides into the slot.

4. The method of manufacturing a heat pipe of claim 1, further comprising the following step:
   (h) injecting a working fluid into the metal tube;
   (i) closing the open end; and
   (j) bending the metal tube to form a bent portion on the metal tube, wherein the clearance area is at an inner side or an outer side of the bent portion.

5. The method of manufacturing a heat pipe of claim 4, wherein in the step (j), a value of a bending radius of the bent portion is smaller than three times a value of a diameter of the metal tube.

* * * * *